(12) United States Patent
Kang et al.

(10) Patent No.: US 8,294,521 B2
(45) Date of Patent: Oct. 23, 2012

(54) POWER AMPLIFIER HAVING DEPLETION MODE HIGH ELECTRON MOBILITY TRANSISTOR

(75) Inventors: Dong Min Kang, Daejeon (KR); Hong Gu Ji, Daejeon (KR); Hokyun Ahn, Daejeon (KR); Jong-Won Lim, Daejeon (KR); Woojin Chang, Daejeon (KR); Sang-Heung Lee, Daejeon (KR); Dong-Young Kim, Daejeon (KR); Hae Cheon Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/855,055

(22) Filed: Aug. 12, 2010

(65) Prior Publication Data

US 2011/0037521 A1     Feb. 17, 2011

(30) Foreign Application Priority Data

Aug. 14, 2009   (KR) .................. 10-2009-0075209

(51) Int. Cl.
*H03F 3/04*   (2006.01)
(52) U.S. Cl. ....................... 330/296; 330/277
(58) Field of Classification Search .......... 330/277, 330/295, 285, 302
See application file for complete search history.

(56) References Cited

U.S. PATENT DOCUMENTS 7,439,805 B1 * 10/2008 Kobayashi .............. 330/277
2007/0290762 A1   12/2007 Lin et al.

FOREIGN PATENT DOCUMENTS

| EP | 1376862 A2 | 1/2004 |
| KR | 10-0251007 B1 | 1/2000 |
| KR | 10-0474567 B1 | 2/2005 |
| KR | 10-2005-0062830 | 6/2005 |
| KR | 10-2006-0122144 A | 11/2006 |

OTHER PUBLICATIONS

M. Park, et al., "Single Supply, High Linearity, High Efficient PHEMT Power Devices and Amplifier for 2 GHz & 5 GHz WLAN Applications", 2003 European Microwave Conference, pp. 371-374 (2003).

* cited by examiner

*Primary Examiner* — Hieu Nguyen
(74) *Attorney, Agent, or Firm* — Rabin & Berdo, P.C.

(57) ABSTRACT

Provided is a power amplifier including: a depletion mode high electron mobility transistor (D-mode HEMT) configured to amplify a signal inputted to a gate terminal and output the amplified signal through a drain terminal; an input matching circuit configured to serially ground the gate terminal; and a DC bias circuit connected between the drain terminal and a ground. Through the foregoing configuration, the HEMT may be biased only by a single DC bias circuit without any biasing means to provide a negative voltage. Also, superior matching characteristic may be provided in various operation frequency bands through a shunt inductor and a choke inductor.

16 Claims, 3 Drawing Sheets

POWER AMPLIFIER HAVING DEPLETION MODE HIGH ELECTRON MOBILITY TRANSISTOR

CROSS-REFERENCE TO RELATED APPLICATIONS

This U.S. non-provisional patent application claims priority under 35 U.S.C. §119 of Korean Patent Application No. 10-2009-0075209, filed on Aug. 14, 2009, the entire contents of which are hereby incorporated by reference.

BACKGROUND

The present invention herein relates to an electronic device, and more particularly, to a power amplifier having a depletion mode high electron mobility transistor (HEMT).

In general, a microwave integrated circuit (MIC) provided with a plurality of amplification transistors is included in a mobile repeater or the like processing microwave signals. The MIC for power amplification amplifies a microwave signal received from an outside and outputs the amplified microwave signal. In particular, for power amplification, a high electron mobility transistor (HEMT) may be used in a microwave band up to about 70 GHz.

The HEMT, which is a compound semiconductor device, has superior electron speed characteristics compared with a silicon device. Therefore, the HEMT is widely applied to a microwave or millimeter wave band (10-100 GHz) device. The HEMT device has advantages that the operation frequency is highest among field effect transistors (FETs) and microwave noise is low. Therefore, HEMT device technologies are being applied in developing a high performance wireless communication circuit operating in a millimeter wave band or an optical communication component having a bit rate beyond several tens Gbps.

HEMTs are classified into a depletion mode (D-mode) HEMT the threshold voltage of which has a negative value, and an enhancement mode HEMT the threshold voltage of which has a positive value. The D-mode HEMT is generally used for the MIC.

For stable operation of the D-mode HEMT, a negative voltage power source should be connected to a gate to which an RF signal is inputted. The D-mode HEMT stably operates without being floated when a negative voltage power source is provided. Also, the D-mode HEMT should be provided with a separate matching circuit so as to obtain matching characteristics in a specific frequency band. However, in order to provide a separate direct current bias circuit such as a negative voltage power source and a matching circuit to the gate of the D-mode HEMT, an additional cost is taken.

SUMMARY

The present invention provides a power amplifier having a depletion mode high mobility electron transistor (HEMT) that can implement a direct current bias and an impedance matching at the same time with a minimum configuration.

Embodiments of the inventive concept provide fiber lasers including: a light source oscillating a laser beam; first and second resonators first and second resonators resonating the laser beam into first and second wavelengths; and a coupler separating and supplying the laser beam oscillated in the light source to the first and second resonators and again feeding back the laser beam having the first and second wavelengths resonated respectively in the first and second resonators to the light source.

In some embodiments, the first and second resonators may include second and third optical fibers branched from the coupler, and first and second Bragg gratings respectively connected to the second and third optical fibers.

In other embodiment, each of the first and second Bragg gratings may include an optical fiber Bragg grating or a polymer Bragg grating.

In still other embodiments, the first and second resonators may further include at least one translator stage straining the first and second Bragg gratings.

In even embodiments, the first and second resonators may include first and second stabilizing light sources supplying stabilizing laser beams respectively stabilizing the laser beams having the first wavelength and the second wavelength, and first and second resonant couplers connecting the first and second stabilizing light sources to the second and third optical fibers, respectively.

In yet embodiments, the coupler may include any one of an optical fiber coupler, a waveguide coupler, and a multi mode interference coupler.

In further embodiments, the light source may include a first optical fiber connected to the coupler, a pump light source supplying a pump light to the first optical fiber, and an output terminal outputting the laser beams having the first and second wavelengths fed back from the coupler.

In still further embodiments, the light source may include a first optical fiber connected to the coupler, and a semiconductor optical amplifier formed in the first optical fiber.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
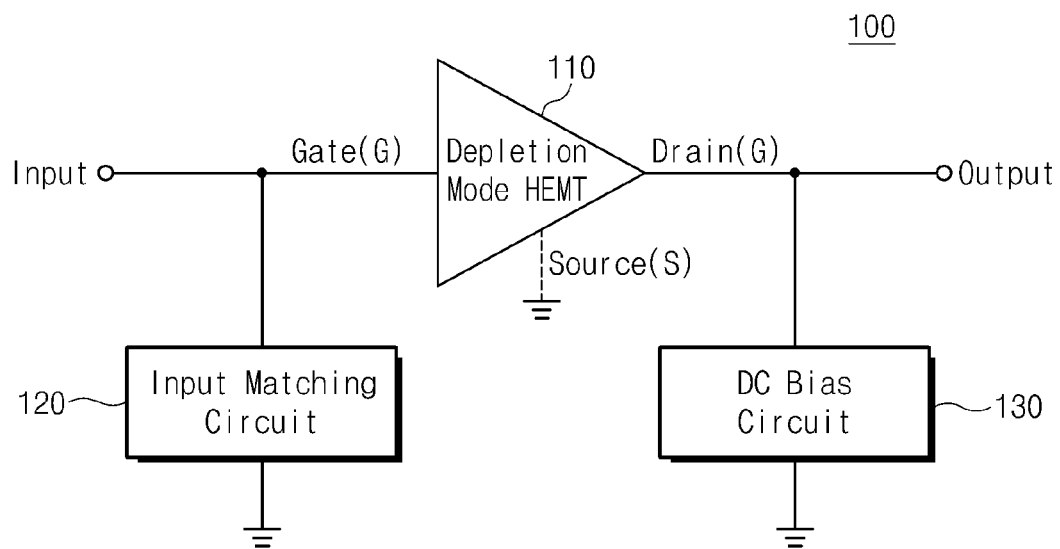
FIG. 1 is a block diagram showing a power amplifier 100 according to the present invention.

It should be construed that foregoing general illustrations and following detailed descriptions are exemplified and an additional explanation of claimed inventions is provided. Reference numerals are indicated in detail in preferred embodiments of the present invention, and their examples are represented in reference drawings. In every possible case, like reference numerals are used for referring to the same or similar elements in the description and drawings. Exemplary embodiments of the present invention will be described below in more detail with reference to the accompanying drawings so that those skilled in the art to which the present invention pertains carry out the technical spirit of the present invention.

FIG. 1 is a block diagram illustrating a power amplifier 100 according to an embodiment of the present invention. Referring to FIG. 1, the power amplifier 100 includes a D-mode HEMT 110, an input matching circuit 120 and a direct current (DC) bias circuit 130.

The D-mode HEMT 110 is a depletion mode transistor the threshold voltage (Vth) of which has a negative value. In order for the configuration of FIG. 1 to operate as a power amplifier, a gate potential of the depletion mode HEMT 110 should be lower than a source potential. In a related art, in order to provide this DC bias condition, a negative DC voltage is provided to the gate of the depletion mode HEMT 110. Also, in order for the depletion mode HEMT 110 to be used as a power amplifier in various frequency bands, the depletion mode HEMT 110 should have an impedance matching characteristic for various frequency bands.

The depletion mode HEMT 110 is supplied with an input signal through the gate terminal. The source terminal of the depletion mode HEMT 110 may be grounded. An output signal is outputted through a drain terminal of the depletion mode HEMT 110. A negative voltage for a DC bias is not provided to the gate terminal of the depletion mode HEMT 110. On the contrary, a positive voltage is provided to the drain terminal for a DC bias.

The input matching circuit 120 is configured to deliver an input RF signal to the gate terminal of the depletion mode HEMT 110 at a minimum loss. If an impedance matching is not achieved, a component of the input signal reflected to an input side increases. As the level of the reflected signal to the input signal increases, the power amplifier 100 may oscillate at a specific frequency band, but the stability is lowered. Generally, an impedance component Zin varies with an operation frequency. Therefore, it should be possible that the input matching circuit 120 adjusts the input impedance of the depletion mode HEMT 110 to a value optimized at a frequency of the input signal.

Additionally, the negative voltage bias is not provided to the gate terminal of the depletion mode HEMT 110. If the negative voltage bias is not provided to the gate terminal of the depletion mode HEMT 110, the gate of the depletion mode HEMT 110 is in an electrical floating state. In this case, the potential of the gate of the depletion mode HEMT 110 may be increased, and the increase in the potential of the gate causes an abrupt increase of a drain-source current Ids. According to the abrupt increase of the drain-source current Ids, the depletion mode HEMT 110 may be destroyed or may malfunction. In conclusion, when the gate is in an electrical floating state, the stability of the depletion mode HEMT 110 is abruptly decreased.

Therefore, the matching circuit 120 should match the input impedance at an operation frequency. Additionally, the input matching circuit 120 should prevent the gate terminal of the depletion mode HEMT 110 from being serially floated. To perform these functions, the input matching circuit 120 may be configured by a shunt inductor serially connecting the gate terminal of the depletion mode HEMT 110 to the ground.

The DC bias circuit 130 is configured to bias the output terminal of the depletion mode HEMT 110, i.e., the drain terminal. The DC bias circuit 130 should provide a positive DC bias voltage to the drain terminal of the depletion mode HEMT 110. Also, the DC bias circuit 130 should have an impedance matching function to deliver an amplified signal to an output side of the depletion mode HEMT 110 without a loss. For example, the DC bias circuit 130 may include a DC power supply for providing a positive voltage and an RF choke inductor. Also, the DC bias circuit 130 may include a bypass unit configured to bypass noise other than an output signal.

In the above, the bias circuit of the depletion mode HEMT 110 that can provide the impedance matching function while being biased by the positive DC power voltage has been described with reference to FIG. 1. In particular, the DC bias of the depletion mode HEMT 110 can be implemented by connecting the single positive power voltage to the drain terminal. By using such a biasing method, the impedance matching at a specific frequency and the DC bias by the single DC voltage can be achieved at the same time.

Figure 2:
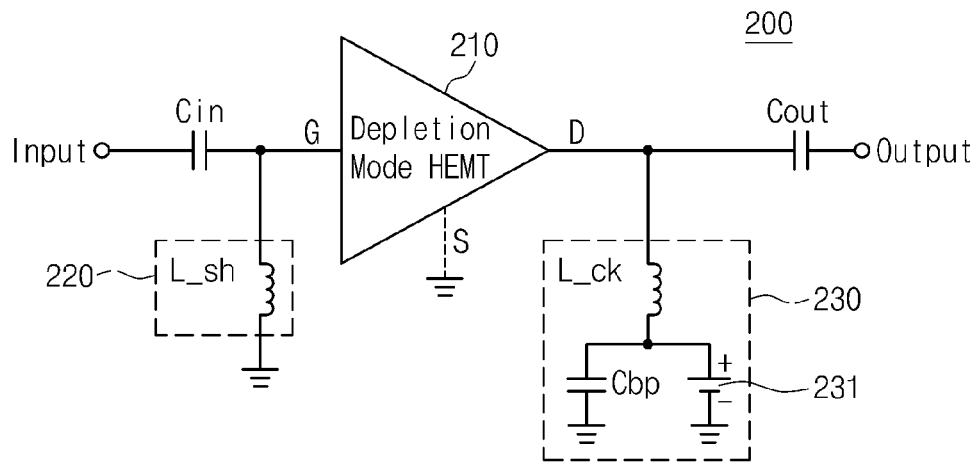
FIG. 2 is a circuit diagram exemplarily showing a power amplifier 200 according to the present invention.

FIG. 2 is a circuit diagram of a power amplifier 200 exemplarily implemented. Referring to FIG. 2, a DC shielding capacitor Cin is connected to a gate terminal of a depletion mode HEMT 210. A shunt inductor L_sh functioning as an input matching circuit 220 is connected between the gate terminal of the depletion mode HEMT 210 and ground. A DC component included in an input signal will be shielded by the DC shielding capacitor Cin. The gate terminal of the depletion mode HEMT 210 is serially grounded by the shunt inductor L_sh.

Another DC shielding capacitor Cout is connected to a drain terminal of the depletion mode HEMT 210. A choke inductor L_ck functioning as a DC bias circuit 230 is connected to the drain terminal of the depletion mode HEMT 210. A bypass capacitor Cbp and a positive DC power source 231 are connected in parallel between the choke inductor L-ck and the ground. Herein, the choke inductor L_ck shields an amplified signal component from being leaked to the ground. Concurrently with this, the choke inductor L_ck may be used as a device for an output terminal impedance matching of the depletion mode HEMT 210. That is, the size of the chock inductor L_ck may be varied such that an output signal of the depletion mode HEMT 210 is delivered to an outside at a maximum.

In the above configuration, the power amplifier 200 in which the positive DC power source is connected only to the drain terminal of the depletion mode HEMT 210 is provided. The power amplifier 200 does not need a separate DC power source circuit to provide a negative voltage to the gate terminal of the depletion mode HEMT 210. Therefore, the gate terminal of the depletion mode HEMT 210 will operate at a single operating point of 0V. If the gate terminal is not serially grounded to the shunt inductor L_sh, the gate of the depletion mode HEMT 210 is electrically floated. In this case, a considerable positive voltage (approximately several hundreds mV) may be generated in the gate terminal. The increase in the gate voltage of the depletion mode HEMT 210 due to the floating of the gate terminal causes an increase in the drain-source current Ids. Therefore, the operation of the depletion mode HEMT 210 is instable and thus excessive heat may be generated. Fixation of the gate terminal by the shunt inductor L_sh is to prevent the foregoing instability.

The foregoing power amplifier 200 may change the frequency band to a desired frequency band by changing the sizes of the shunt inductor L_sh and the choke inductor L_ck. Also, since DC bias is possible only with the single DC power source 231 without a separate power source to provide a negative voltage, biasing cost can be saved.

Figure 3:
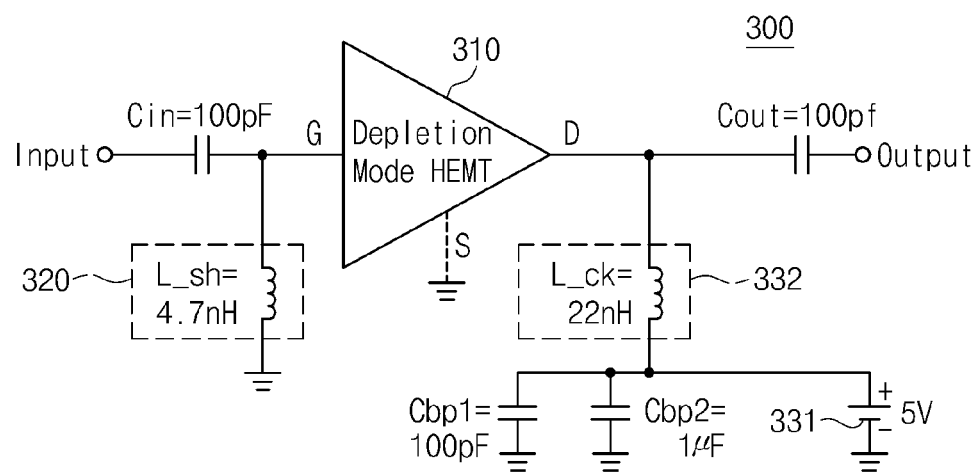
FIG. 3 is a circuit diagram exemplarily showing a power amplifier 300 according to an embodiment of the present invention.

FIG. 3 is a circuit diagram exemplarily showing a power amplifier 300 having an operation frequency band of 900 MHz. Referring to FIG. 3, DC-blocking capacitors Cin and Cout each having a capacitance of 100 pF are respectively connected to an input terminal and an output terminal of a depletion mode HEMT 310. Also, a shunt inductor L_sh having an inductance of 4.7 nH and functioning as an input matching circuit 320 is connected between a gate terminal of the depletion mode HEMT 310 and ground.

A choke inductor L_ck which has an inductance of 22 nH and functions as a part of a DC bias circuit 330 is connected to a drain terminal of the depletion mode HEMT 310. Also, bypass capacitors Cbp1 and Cbp2 connected in parallel to provide a capacitance of 1000.1 nF and a +5V power source 331 are connected between the choke inductor L_ck having the inductance of 22 nH and the ground.

Figure 4:
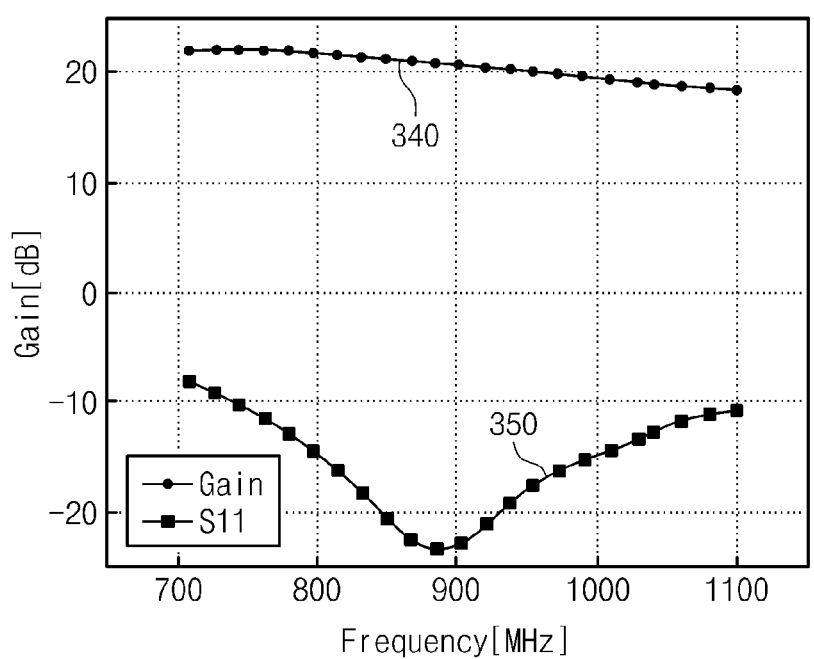
FIG. 4 is a graph showing gain characteristic and input matching characteristic of the power amplifier 300 of FIG. 3.

FIG. 4 is a graph showing a gain characteristic and an input matching characteristic (S-parameter, input reflection loss) of the power amplifier 300 under the bias condition of FIG. 3. Referring to FIG. 4, a gain curve 340 of the power amplifier 300 shows a stable gain of about 20 dB at a frequency band of 700 MHz to 1100 MHz. According to the gain curve 340, it is observed that the power amplifier 300 may provide a gain of 20 dB at a frequency band of 900 MHz.

An input matching characteristic curve 350 represents an input reflection loss of the power amplifier 300. In particular, the input matching characteristic curve 350 represents an input reflection coefficient S11 among S-parameters. The input reflection coefficient S11 indicates a ratio of a level of a component again reflected to the input terminal to a level of the input signal. That is, the input reflection coefficient S11 is a value to determine the degree of impedance matching. As shown in the graph, the input reflection coefficient S11 was less than −20 dB as measured at the frequency band of about 900 MHz. Also, the input reflection coefficient S11 was smallest around 900 MHz. That is, it is meant that the reflection loss of the input signal was minimized by the shunt inductor L_sh having the inductance of 4.7 nH and connected to the gate terminal of the depletion mode HEMT 310 and the choke inductor L_ck having the inductance of 22 nH and connected to the drain terminal of the depletion mode HEMT 310.

Figure 5:
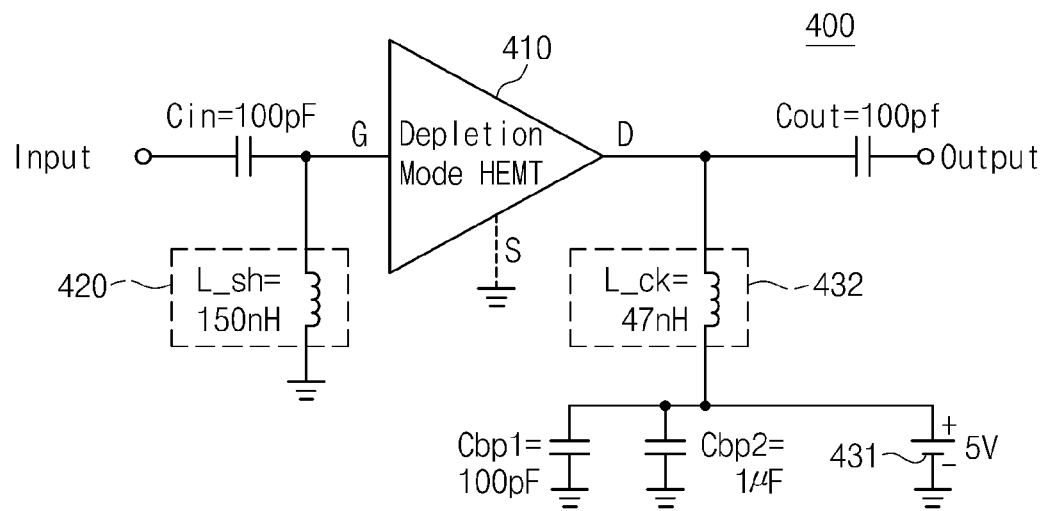
FIG. 5 is a circuit diagram exemplarily showing a power amplifier 400 according to another embodiment of the present invention.

FIG. 5 is a circuit diagram of a power amplifier 400 operating at an operation frequency band of 3500 MHz. Referring to FIG. 5, DC shielding capacitors Cin and Cout each having a capacitance of 100 pF are respectively connected to an input terminal and an output terminal of a depletion mode HEMT 410. Also, a shunt inductor L_sh having an inductance of 150 nH and functioning as an input matching circuit 420 is connected between a gate terminal of the depletion mode HEMT 410 and ground.

A choke inductor L_ck which has an inductance of 47 nH and functions as a part of a DC bias circuit 430 is connected to a drain terminal of the depletion mode HEMT 410. Also, bypass capacitors Cbp1 and Cbp2 connected in parallel to provide a capacitance of 1000.1 nF and a +5V power source 431 are connected between the choke inductor L_ck having the inductance of 47 nH and the ground.

Figure 6:
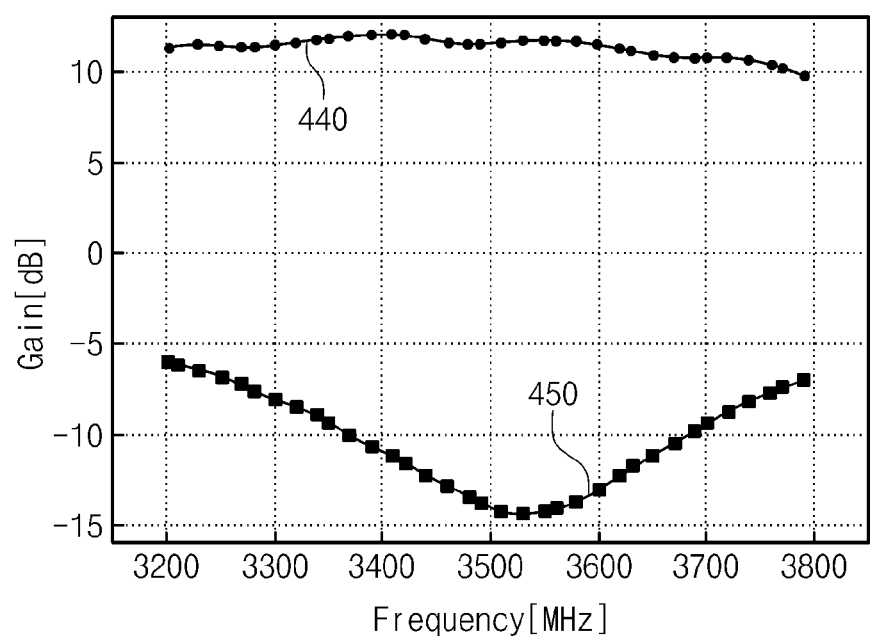
FIG. 6 is a graph showing gain characteristic and input matching characteristic of the power amplifier 400 of FIG. 5.

FIG. 6 is a graph showing a gain characteristic and an input matching characteristic (S-parameter, input reflection loss) of the power amplifier 400 under the bias condition of FIG. 5. Referring to FIG. 6, a gain curve 440 shows about 10 dB or more gain characteristic at a frequency band of 3200 MHz to 3800 MHz. According to the gain curve 440, it is observed that the power amplifier 400 may provide a gain of about 12 dB at a frequency band of 3500 MHz.

An input matching characteristic curve 450 represents an input reflection loss of the power amplifier 400. The input matching characteristic curve 450 represents an input reflection coefficient S11 among S-parameters. The input reflection coefficient S11 represents a ratio of a component reflected to the input terminal to the input signal of the power amplifier 400. As shown in the graph, the input reflection coefficient S11 was less than −15 dB as measured at the frequency band of about 3500 MHz. Also, the input reflection coefficient S11 was smallest around 3500 MHz. That is, it is meant that the reflection loss of the input signal was minimized by the shunt inductor L_sh having the inductance of 150 nH and connected to the gate terminal of the depletion mode HEMT 410 and the choke inductor L_ck having the inductance of 47 nH and connected to the drain terminal of the depletion mode HEMT 410.

As described above, the power amplifier including the D-mode HEMT according to the present invention can implement the DC bias and impedance matching with a minimum configuration. Also, the power amplifier including the D-mode HEMT according to the present invention can shield input reflection loss and obtain stable gain in various operation frequency bands.

While the present invention has been particularly shown and described with reference to exemplary embodiments thereof, it will be understood by those of ordinary skill in the art that various changes in form and details may be made therein without departing from the scope of the present invention. Hence, the scope of the present invention shall not be determined only by the above-described embodiments but shall be determined by the accompanying Claims and their equivalents.

What is claimed is:
1. A power amplifier comprising:
    a depletion mode high electron mobility transistor (D-mode HEMT) having a gate terminal and a drain terminal, the D-mode HEMT being configured to amplify a signal inputted to the gate terminal and output the amplified signal through the drain terminal without a negative gate bias being applied to the gate terminal;
    an input matching circuit, having a first inductor configured to serially ground the gate terminal;
    a DC bias circuit, having a second inductor connected between the drain terminal and a ground, the second inductor being configured to operate as an output matching circuit; and
    a first DC shielding capacitor connected in series between an input terminal and the gate terminal of the D-mode HEMT so that no transistor is disposed between the D-mode HEMT and the first DC shielding capacitor,
    wherein a frequency band of the power amplifier is adjusted by varying at least one of the first and second inductors.

2. The power amplifier of claim 1, wherein a source terminal of the D-mode HEMT is grounded.

3. The power amplifier of claim 1, wherein the first inductor comprises a shunt inductor connected between the gate terminal and the ground.

4. The power amplifier of claim 3, wherein an inductance of the shunt inductor varies with an operation frequency of the D-mode HEMT.

5. The power amplifier of claim 4, wherein the inductance of the shunt inductor is controlled to a level to shield an input reflection loss of the input signal at the operation frequency.

6. The power amplifier of claim 1, wherein the second inductor is a choke inductor connected to the drain terminal, and the DC bias circuit comprises:
    a bypass capacitor connected between the choke inductor and the ground; and
    a positive DC power source connected between the choke inductor and the ground.

7. The power amplifier of claim 6, wherein an inductance of the choke inductor varies with an operation frequency of the D-mode HEMT.

8. The power amplifier of claim 1, further comprising a second DC shielding capacitor connected in series between the drain terminal of the D-mode HEMT and an output terminal.

9. The power amplifier of claim 6, wherein the bypass capacitor and the positive DC power source are connected in parallel.

10. The power amplifier of claim 1, wherein the second inductor is a choke inductor connected to the drain terminal and the DC bias circuit comprises:
  a first bypass capacitor connected between the choke inductor and the ground; and
  a second bypass capacitor connected between the choke inductor and the ground in parallel with the first bypass capacitor, the first bypass capacitor and the second bypass capacitor having capacitances different from each other.

11. The power amplifier of claim 1, wherein the input matching circuit adjusts an input impedance of the D-mode HEMT to a value that minimizes reflection loss of the input signal at a predetermined frequency of the input signal.

12. The power amplifier of claim 11, wherein the DC bias circuit adjusts an output impedance of the D-mode HEMT to maximize a power of the output, amplified signal of the D-mode HEMT when the input signal is at the predetermined frequency.

13. The power amplifier of claim 1, wherein the input matching circuit minimizes reflection loss of the input signal of the D-mode HEMT at a predetermined frequency of the input signal.

14. The power amplifier of claim 1, wherein a size of at least one of the first and second inductors is varied so as to adjust the frequency band.

15. The power amplifier of claim 1, wherein an inductance of at least one of the first and second inductors is varied so as to adjust the frequency band.

16. The power amplifier of claim 1, wherein the first DC shielding capacitor is connected between the input terminal and the first inductor.

* * * * *